United States Patent [19]

Symons

[11] Patent Number: 4,931,695

[45] Date of Patent: Jun. 5, 1990

[54] HIGH PERFORMANCE EXTENDED INTERACTION OUTPUT CIRCUIT

[75] Inventor: Robert S. Symons, Los Altos, Calif.

[73] Assignee: Litton Systems, Inc., Beverly Hills, Calif.

[21] Appl. No.: 202,190

[22] Filed: Jun. 2, 1988

[51] Int. Cl.$^{5}$ ........................ H01J 25/10; H01P 7/06; H03F 3/56; H03B 9/04

[52] U.S. Cl. .................................. 315/5.39; 315/5.43; 315/5.51; 331/83; 330/45; 333/230

[58] Field of Search .................... 315/5.39, 5.43, 5.51, 315/5, 53; 330/49, 45; 331/33, 230

[56] References Cited

U.S. PATENT DOCUMENTS

| | | | |
|---|---|---|---|
| 2,963,616 | 12/1960 | Nelson et al. | 333/230 |
| 2,972,081 | 2/1961 | Bridges et al. | 333/230 |
| 3,466,576 | 9/1969 | Bert | 333/33 |
| 3,521,116 | 7/1970 | Potzl | 315/5 |
| 3,787,748 | 1/1974 | Liepelt | 315/5.53 |
| 3,970,952 | 7/1976 | Mizuhara | 315/5.21 |
| 4,147,956 | 4/1979 | Horigome et al. | 315/3.6 |
| 4,284,922 | 8/1981 | Perring et al. | 315/5.43 |

*Primary Examiner*—Eugene R. LaRoche
*Assistant Examiner*—Michael B. Shingleton
*Attorney, Agent, or Firm*—Poms, Smith, Lande & Rose

[57] ABSTRACT

There is provided a high performance extended interaction output circuit [EIOC] having two cavities. The EIOC of the present invention has an image impedance which is twice the magnitude of its output load resistance. The EIOC of the present invention also includes a three cavity EIOC which has two image impedances, the second image impedance being one half the magnitude of the first image impedance while the output load impedance of the three cavity EIOC is one third the magnitude of the first image impedance.

10 Claims, 5 Drawing Sheets

HIGH PERFORMANCE EXTENDED INTERACTION OUTPUT CIRCUIT

FIELD OF THE INVENTION

The present invention relates to electromagnetic output circuits for extracting RF electromagnetic energy from a bunched electron beam and, more particularly, to extended interaction output circuits for klystrons or traveling wave tubes having two or more gaps.

BACKGROUND OF THE INVENTION

Linear beam tubes have been used in sophisticated communications and radar systems which require amplification of an RF or microwave electromagnetic signal. An example of a linear beam tube microwave amplifier is a conventional klystron. A conventional klystron comprises a number of cavities divided into, essentially, three sections, an input section, a buncher or amplification section, and an output section. An electron beam is sent through the klystron, and the buncher section amplifies the modulation on the electron beam and produces a highly bunched beam which contains an RF current. Various improvements in conventional klystrons have been attempted to increase bandwidth and/or efficiency. U.S. Pat. No. 3,375,397 and U.S. Pat. No. 4,284,922 disclose such klystrons.

An example of a high performance broad band klystron cavity arrangement is disclosed in continuation application Ser. No. 07/106,976, filed Oct. 1, 1987 which is a continuation of parent application Ser. No. 06/663,801, filed Oct. 23, 1984 which is hereby incorporated by reference. Also incorporated by reference is U.S. patent application Ser. No. 07/201,560 entitled "Coupled Cavity Circuit with Increased Iris Resonant Frequency." Both of the aforementioned applications are owned by the common owner [for a detailed explanation of broad band klystrons, refer to IEEE, Vol. 70, No. 11, November, 1982, pp. 1308–1310].

The invention disclosed in U.S. continuation application Ser. No. 07/106,976 is a clustered cavity klystron in which the bunching or amplification section produces a high RF power gain over a broad bandwidth.

In klystrons, the bandwidth is usually limited by the bandwidth of the output section. Prior art output sections of klystrons employing a single cavity interacting with the electron beam and a filter cavity (also called "resonator") to provide a double-tuned-circuit response have been used. In addition, klystron output circuits having more than one cavity interacting with the electron beam, which are termed in the art as extended-interaction output circuits (EIOC), have also been employed. EIOCs have the advantage that energy can be removed from the electrons over a wide band of frequencies because there is less voltage at each of the gaps of the EIOC, even though the total energy (voltage) change experienced by an electron beam can be the same as that provided by a single gap with a higher radio frequency voltage. High efficiency EIOCs are particularly necessary in use with a high gain broad bandwidth clustered cavity arrangement as disclosed in U.S. continuation application Ser. No. 07/106,976. Designers of prior art EIOCs which have been built and designed in the past, [such as that described in Mann, J. "Extended Interaction Resonator Development"-]recognized that having two gaps at the output of a klystron is advantageous because the gaps act in series with the modulated electron stream traveling therethrough, thereby causing a low voltage drop across each gap, increasing bandwidth and diminishing power loss. Such prior art EIOCs have been designed by way of trial and error parameter selection followed by empirical, analytic methods. Prior art EIOCs have been limited to two cavities having a certain bandwidth and efficiency. Due to the trial and error technique of parameter selection and therefore building of such output circuits, the prior art has been unable to develop more efficient EIOCS having two, three, or more cavities.

It is therefore an object of the present invention to provide a two and three or more cavity electromagnetic output tube circuit for extracting from an electron beam amplified RF electromagnetic energy, such as that amplified within klystrons and traveling wave tubes which, has a broad bandwidth and a high RF power output.

It is a further object of the present invention to provide a unique electromagnetic output circuit which may be designed without the need for extensive trial and error parameter selection.

Further objects of the present invention will become apparent after a reading of the foregoing specification.

The aforementioned objects are achieved in an electromagnetic output circuit for outputting RF electromagnetic energy to a transmission means, the electromagnetic output circuit receiving a modulated electron beam and producing RF electromagnetic energy. The electromagnetic output circuit comprising a first cavity, the first cavity having a gap for permitting the traveling therethrough of the modulated electron beam and coupling means for permitting the traveling there-through of the electromagnetic energy. The invented electromagnetic output circuit also includes a second cavity which is coupled to the first cavity, the second cavity having a second gap for permitting the traveling therethrough of the modulated electron beam and a second coupling means for permitting the traveling therethrough of the electromagnetic energy. The distance between the first gap and the second gap is sufficient to cause a phase shift in the modulated electron beam between the first and second gaps which is substantially equal to the phase shift occurring in the electromagnetic wave between the first and second gaps; wherein the volume of the first and second cavities and the dimensions of the gaps and the first and second coupling means are proportioned such that the image impedance of the electromagnetic output circuit is approximately twice the magnitude of its output load impedance.

The above-described electromagnetic output circuit may also comprise a third cavity, the third cavity being coupled to the second cavity and having a third gap for permitting the traveling therethrough of the modulated electron beam, the third cavity also having a third coupling means for permitting the traveling therethrough of the electromagnetic energy, the distance between the second and third gaps being sufficient to cause a phase shift in the modulated electron beam between the second and third gap which is substantially equal to the phase shift occurring in the electromagnetic wave between the second and third gaps. The first, second and third cavities, the first, second and third gaps, and the first, second and third coupling means act as two microwave filter sections having first and second image impedances, respectively, wherein the second image impedance is one half the magnitude of the first image impedance and wherein the output impedance is one third the magnitude of the first image impedance.

BRIEF DESCRIPTION OF THE DRAWINGS

In FIG. 5 there is shown a bottom plan cross-sectional view of the three cavity EIOC of FIG. 3 taken along lines 5—5 of FIG. 3;

DETAILED DESCRIPTION OF THE INVENTION

Figure 1:
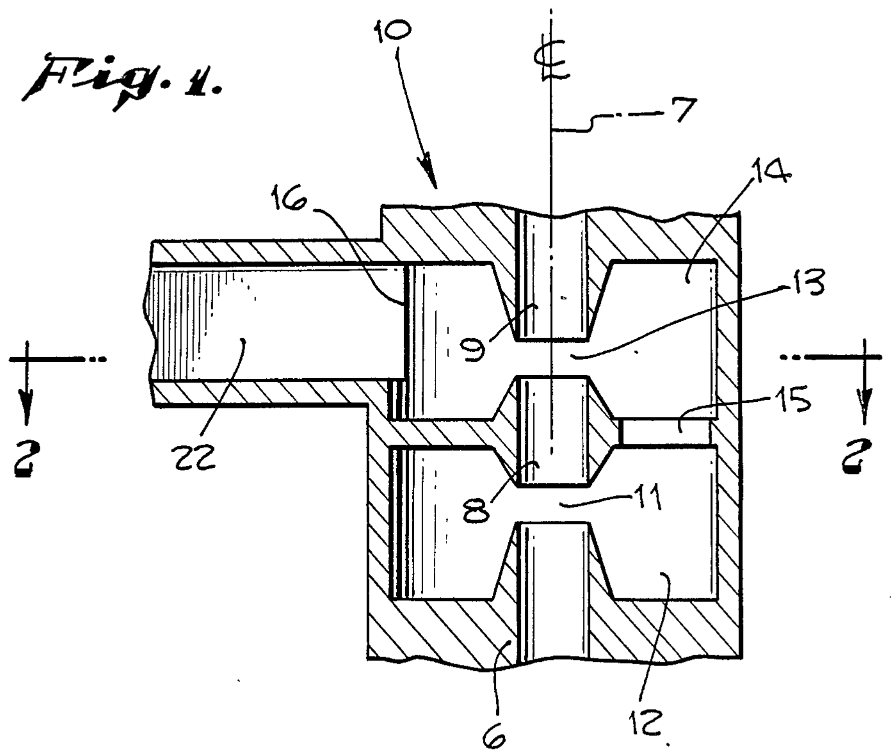
In FIG. 1 there is shown a longitudinal cross-sectional view of a two cavity EIOC embodying the concepts of the present invention.
Figure 2:
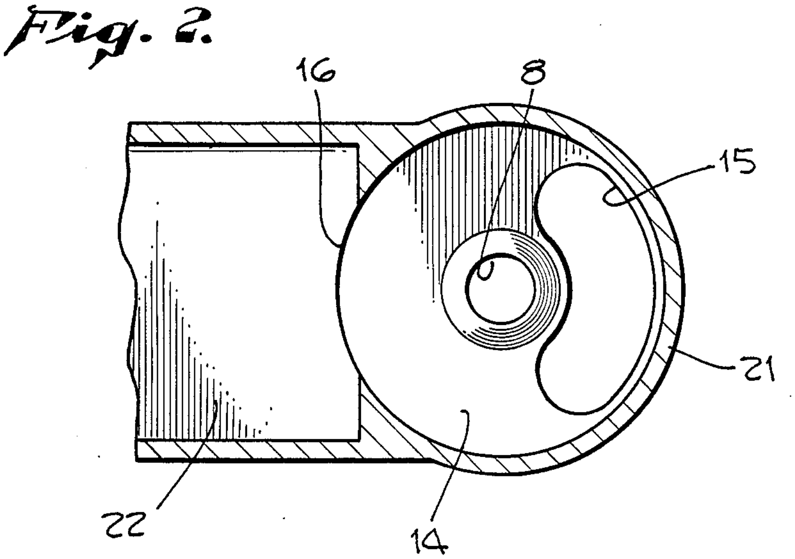
In FIG. 2 there is shown a top plan cross-sectional view of the two cavity EIOC of FIG. 1.

In FIGS. 1 and 2 there is shown, respectively, a longitudinal cross-sectional view and a top plan cross-sectional view of a two cavity extended interaction output circuit, generally denoted by reference numeral 10, embodying the concepts of the present invention. The following description will be made with reference to FIGS. 1 and 2. A modulated bunched electron beam represented by beam 7 in FIG. 1 is received by the extended interaction output circuit 10 through a first drift tube section 6, a first gap 11 and a first cavity 12. The beam then passes through second drift tube section 8, a second gap 13 and a second cavity 14. Spent electrons of the beam exit through drift tube section 9 to a collector not shown.

The bunched beam excites the first cavity 12 and creates an electromagnetic field which produces an RF magnetic wave which propagates through an electromagnetic coupling means 15, which is comprised of an aperture of a predetermined size, into the second cavity 14. Similarly, as the modulated electron beam passes across the second gap 13 of the second cavity 14, the modulated electron beam further reinforces the RF electromagnetic wave. The RF wave then propagates through a second electromagnetic coupling means 16 in the wall separating the cavity 14 from an output wave guide 22. The output wave guide 22 serves as an output transmission line for the amplified RF energy. The distance between the first gap 11 and the second gap 13 of FIG. 1 is sufficient to cause a phase shift in the modulated electron beam, between gap 11 and gap 13, approximately equal to the phase shift occurring in the RF electromagnetic energy between gap 11 and gap 13 of FIG. 1. It has been discovered by the present inventor that optimum performance is achieved when the volume of cavities 12 and 14, the proportions of the gaps 11 and 13, and the proportions of the electromagnetic coupling means 16 are accurately dimensioned such that the image impedance of the microwave output circuit of FIG. 1 is approximately two times greater in magnitude than its output load impedance. The above described tapering of impedances create an extended interaction output circuit having a high efficiency with low power loss over a very broad bandwidth as compared with the prior art.

Figure 3:
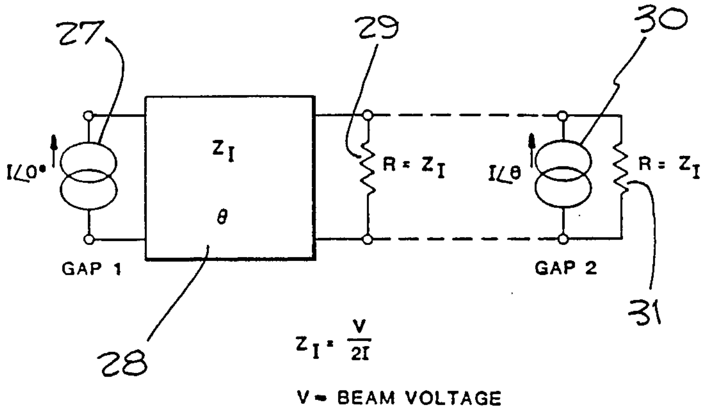
In FIG. 3 there is shown an electrical equivalent circuit of the extended interaction output circuit shown in FIG. 1.

In FIG. 3 there is shown a four terminal circuit which is the electrical equivalent of the extended interaction output circuit shown in FIG. 1. The circuit of FIG. 1 comprises a first current generator 27, a filter circuit 28 having an image impedance $Z_I$ and an image transfer constant of $\theta$, a first resistance 29 having an impedance equal to $Z_I$, a second current generator 30 and a second resistance 31 having a resistance equal to $Z_I$. The description of the equivalent circuit of FIG. 2 will be made with reference to the corresponding structure shown in FIGS. 1–2.

The first current generator 27 represents the modulated electron beam 7 of FIG. 1 at its entrance into the first gap 11 of the first cavity 12. The phase of the current generated by current generator 27 is therefore taken as a reference angle at 0° as shown in FIG. 3. The filter circuit 28 having an impedance of $Z_I$ comprises the capacity of the first cavity 12 of FIG. 1, which capacity occurs primarily at first gap 11 of the cavity 12, the inductance of the first cavity 12, which is associated primarily with the volume thereof, the impedance of the electromagnetic coupling means 15 between the first cavity 12 and the second cavity 14, the inductance of the second cavity 14 and the capacitance of the second cavity 14.

Filter 28 has an image transfer constant of $\theta$. "Resistances 29 and 31 represents the load impedance" provided by the electromagnetic coupling means and the output wave guide 22.

The current generator 31 represents the modulated electron beam current at the second gap 13 of FIG. 1 and produces a current equal to that of generator 27. This current is at an angle of $\theta$ and has experienced a phase shift of $\theta$ between the first gap 11 and the second gap 13. It will be apparent to those skilled in the art that if resistance 31 is equal in magnitude to resistance 29 and both are equal to $Z_I$, the voltages across them are equal and, no current flows between the two through the connections represented as dotted lines. The output load resistance of the equivalent circuit of FIG. 3 is resistance 29 in parallel with resistance 31 which, is equal to the impedance of $Z_I/2$. Accordingly, the equivalent filter circuit of FIG. 3 has an output load impedance which, in the preferred embodiment, is designed to be one half the magnitude of its image impedance.

The image impedance $Z_I$ is, in the preferred embodiment, adjusted so a radio frequency voltage equal to one-half the D.C. beam voltage exists across each gap. This will often be approximately equal to V/2I where V equals the electron beam voltage and I equals the electron beam current. [A detailed description of image-matched network theory is described in Terman, F. E., "Radio Engineers Handbook," McGraw-Hill, N.Y. (1943)] It will therefore be appreciated, in view of the above description, that the network of FIG. 3 will act as if it is terminated in its image impedance, no significant backward or reflected wave will be sent back to gap 1 of FIG. 1 from the network load.

It is well known in the art that all of the electrical properties of a multiport network can be determined by making measurements of the impedance in one port while placing short circuits, open circuits or terminating resistors on other ports in various arrangements.

An EIOC having the aforementioned characteristics described with reference to FIGS. 1-3 produces greater power over a broader bandwidth than prior art two cavity EIOCs. It will further be appreciated, in view of the above description, that in order to design a two cavity EIOC having the aforementioned electrical characteristics, the volume and dimensions of the first cavity 12 of FIG. 1, the proportion and size of the electromagnetic coupling means 15, the volume and size of the second cavity 14, the proportion and size, of the output electromagnetic coupling means 16 as well as the dimensions of the gaps 11 and 13 must be accurately proportioned in order to create the desired inductive capacitive impedances such that the output load impedance is one half that of the image impedance.

Figure 8:
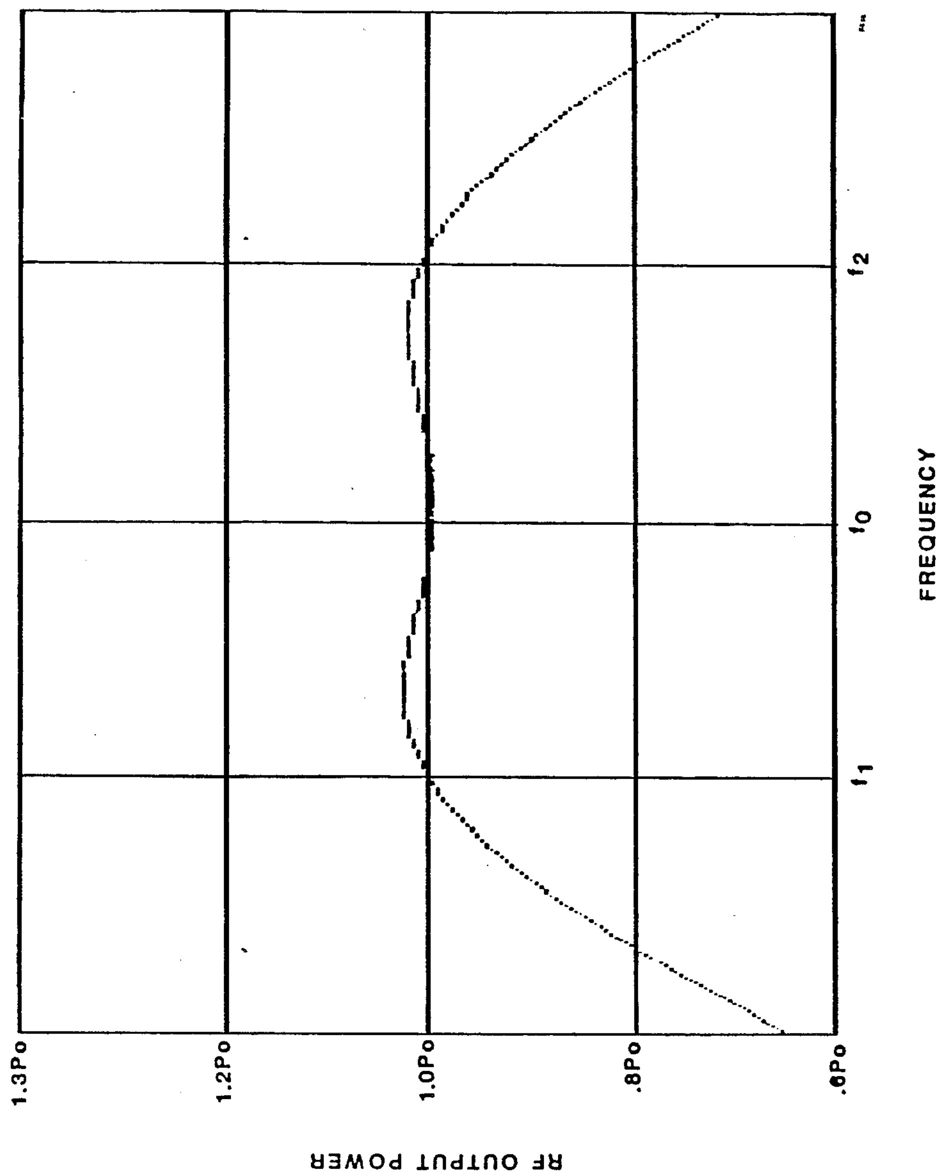
In FIG. 8 there is shown an RF output power versus frequency performance bandwidth chart for a two cavity EIOC embodying the concepts of the present invention.

Turning now to FIG. 8 there is shown an RF power versus frequency chart for the two cavity EIOC shown in FIG. 1 from which it will be apparent that the invented EIOC produces a relatively high power output over a broad bandwidth. In operation of a built and tested device embodying the concepts of the present invention $f_1$ of FIG. 8 is equal to approximately 2.9GHz while $f_2$ is equal to approximately 3.3GHz, and $P_0$ is equal to approximately 3MW.

Figure 4:
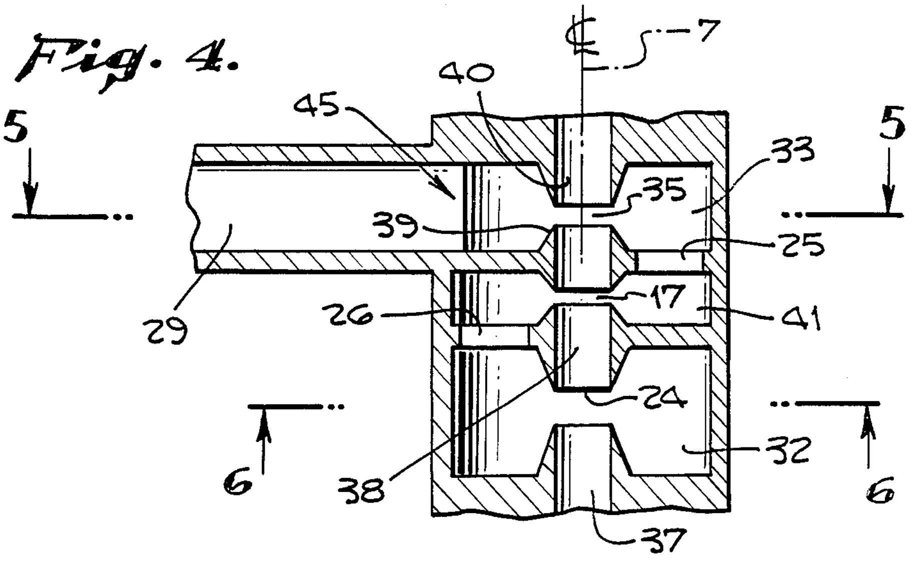
In FIG. 4 there is shown a longitudinal cross-sectional view of a three cavity EIOC embodying the concepts of the present invention.
Figure 5:
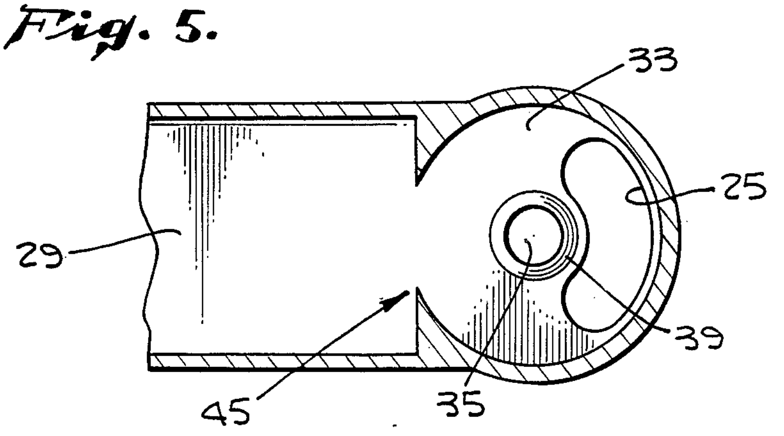
In FIG. 5 there is shown a top plan cross-sectional view of the three cavity EIOC of FIG. 3, taken along lines 4—4 of FIG. 3.
Figure 6:
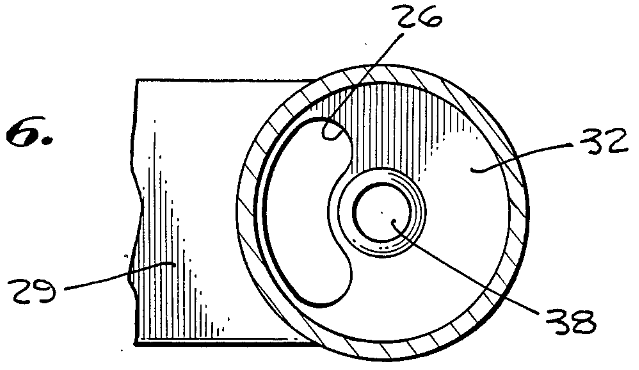

In FIG. 4 there is shown a longitudinal cross-sectional view of a three cavity EIOC embodying the concepts of the present invention. FIG. 5 shows a top plan cross-sectional view taken along lines 5—5 of FIG. 4 while FIG. 6 shows a bottom plan cross-sectional view of FIG. 4 taken along lines 6—6. The description of the three cavity EIOC will be made with reference to FIGS. 4-5. The unique concepts of the present invention make it possible to construct an efficient three cavity EIOC having a broad bandwidth which has not, heretofore, been accomplished in the prior art.

Similar to the two cavity EIOC of FIGS. 1 and 2, a modulated electron beam represented by arrow 7 enters a first cavity 32 through drift tube section 37 into a first gap 24 through a second drift tube section 38 into a second cavity 41 across a second gap 17, through a third drift tube section 39, across a third gap 29 and out through a fourth drift tube section 40 for collection by an electron collector not shown. The modulated electron beam creates an RF electromagnetic wave within cavity 32 at the first gap 24. The RF electromagnetic wave propagated in the second cavity 41 is reinforced in its propagation across gap 17 of cavity 41 and propagates through electromagnetic coupling means 25 into a third cavity 33. The electromagnetic RF energy present in the third cavity 33 is reinforced in its propagation across a third cavity gap 35 and exits the third cavity through electromagnetic coupling means 45 which is coupled to an output wave guide 29. The output load impedance presented to the EIOC is determined by the size of the output electromagnetic coupling means 45 and the dimensions of the output wave guide 29. As with the two cavity EIOC of FIGS. 1 and 2, the distance between the first gap 24 and the second gap 17 of the three cavity EIOC of FIGS. 4-6 is sufficient to cause a phase shift in the electron beam, between gaps 24 and 17, approximately equal to the phase shift occurring in the RF energy between gaps 24 and 17. Similarly, the distance between the second gap 17 and the third gap 35 is sufficient to cause a phase shift in the modulated electron beam approximately equal to the phase shift occurring in the RF energy between gaps 17 and 35.

The EIOC shown in FIGS. 4-6 is electrically equivalent to a two section filter circuit having two different image impedances in each of the two sections and an output load impedance. It has been discovered by the inventor that an EIOC having a first section image impedance of $Z_I$ should have a second image impedance of $Z_I/2$ while the output load impedance should be $Z_I/3$. An EIOC having such characteristics will have higher efficiency, less power loss and a broader bandwidth than has heretofore been realized in the prior art.

Figure 7:
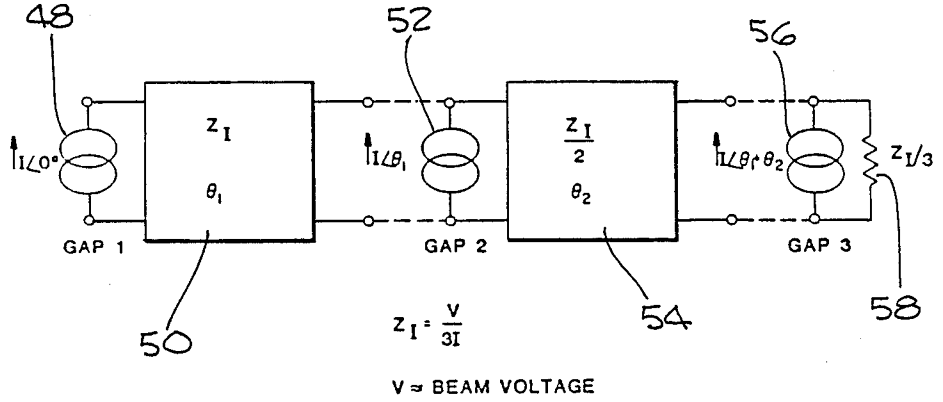
In FIG. 7 there is shown an electrical equivalent circuit of the extended interaction output circuit of FIG. 4.

In FIG. 6 there is shown an equivalent circuit of the EIOC shown in FIGS. 4-6. The equivalent circuit of FIG. 7 represents a two-filter network having tapering impedances which yield a high power output at a broad bandwidth without significant generation of reflected waves. The following description will be made with reference to FIGS. 4, 5 and 6 as well as FIG. 7. The equivalent circuit of FIG. 7 is comprised of a constant current generator 48 which represents the modulated electron beam current present at the first gap 24 of FIG. 4. The current of current generator 48 is taken at a reference angle of 0°. Current generator 48 is coupled to a filter circuit 50 which has an impedance of $Z_I$ and an image transfer constant of $\theta_1$. $Z_I$ represents the capacitance of the first cavity 32 of FIG. 4, the inductance of the first cavity 32, the impedance of the first electromagnetic coupling means 26, of the second and portions of the inductance and capacitance of the second cavity 41. For best efficiency, the image impedance $Z_I$ is in the order of V/3I while V equals the beam voltage and I represents the beam current.

A second current-generator 52 which generates a constant current essentially equal in magnitude to that of generator 48 at angle $\theta_1$ represents the modulated electron beam current at the second gap 17. $\theta$ represents the phase shift in the modulated beam between the first gap 24 and the second gap 17 of FIG. 4. The current generator 52 coupled to a second filter 54 which has an impedance of $Z_I/2$ and an image transfer constant of $\theta_2$. The second filter 54 represents the remaining portions of the inductance and capacitance of the second cavity 41 of the EIOC of FIG. 4, the impedance of the electromagnetic coupling 25 between the second cavity 41 and the third cavity 33 and the capacitance and inductance of the third cavity 33. Since the capacitance of the second cavity 41 of FIG. 4 is divided among the first and second filters 50 and 54 of FIG. 7, the size of the gap 17 of the second cavity 41 may be smaller, as compared to cavities 33 and 32, in order to increase the capacitance of cavity 41. The volume of cavity 41 is also smaller in order to maintain the same resonant frequency, as will be appreciated by those skilled in the art.

A third current generator 56 is coupled to an output load resistance 58 having an impedance of $Z/I_3$. The third current generator 56 producing a current magnitude similar to that of generator 48 represents the beam current at the third gap 35 of FIG. 4 and has a phase, with respect to the phase of the current at the first gap 24, of $\theta_1+\theta_2$. $\theta_1+\theta_2$ represents the phase shift which occurs in the modulated beam from the second gap 17 to the third gap 35. Current generator 56 is coupled to an output load resistance 58 which has an output load resistance of $Z_I/3$. It will be appreciated that the electrical components of filter 50 and filter 54 and output load resistance 58 of the equivalent circuit of FIG. 7 are determined in the same fashion as previously described with respect to the equivalent circuit of the two cavity EIOC of FIGS. 1 and 2. As such, by appropriately dimensioning the volume of the three cavities of the EIOC of FIG. 4, the size of the electromagnetic coupling means and the proportions of the three gaps in order to achieve the impedances of the equivalent circuit of FIG. 7, the EIOC of FIGS. 4–7 can achieve greater efficiency at a broader bandwidth than has heretofore been realized in the prior art.

Figure 9:
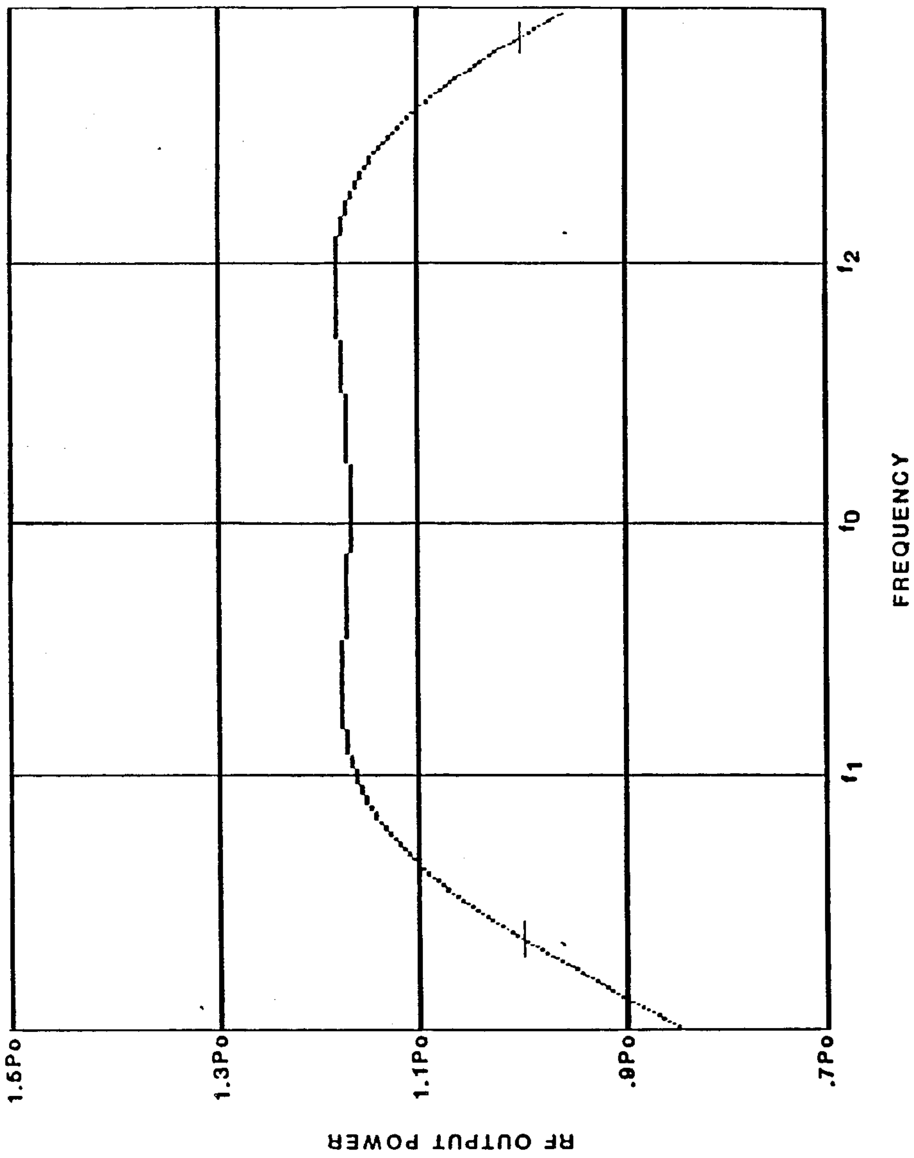
In FIG. 9 there is shown an RF output power versus frequency bandwidth chart for a three cavity EIOC embodying the concepts of the present invention.

In FIG. 9 there is shown the calculated performance, as RF power versus frequency, for the three cavity EIOC shown and described with reference to FIGS. 4–7. The parameters for $f_1$, $f_2$ and $P_0$ are the same as the parameters previously mentioned with respect to FIG. 8. It will be noted that the three cavity EIOC of the present invention has a broader bandwidth having a flatter plateau at higher output power than the two cavity EIOC previously described with respect to FIGS. 2–3 and 8.

It will be appreciated that the structure and concepts of the above described present invention may also be employed with other linear beam tubes such as traveling wave tubes, and that the concepts of the present invention may be extended beyond three cavity output circuits having four, five or more cavities by tapering the impedances levels as $Z_I$, $Z_I/2$, $Z_I/3$. $Z_I/4$, etc. Further, the present invention is not limited to the specific structure shown in FIGS. 1–2 and 4–6. For example the cavities may have a polygonal shape and the various electromagnetic coupling means may be other than the crescent-shaped openings or irises shown.

It will be further appreciated that the present invention may be embodied in other specific forms without departing from the spirit or essential characteristics thereof. The present embodiments are to be considered in all aspects as illustrative and unrestrictive, the scope of the invention being indicated by the appended claims rather than by the foregoing description, and all changes which come within the meaning and range of equivalency are, therefore, intended to be embraced therein.

What is claimed is:

1. An extended interaction output circuit [EIOC] for interacting with a modulated electron beam and for outputting RF electromagnetic energy, said EIOC comprising:

a pair of coupled cavities having a predetermined image impedance;

said coupled cavities also having predetermined output load impedance, said output load impedance being approximately one half the magnitude of said image impedance.

2. The apparatus according to claim 1 wherein:

a first cavity among said pair of coupled cavities further comprises a first gap and wherein;

a second cavity among said pair of coupled cavities further comprises a second gap;

said first cavity and said second cavity sharing a first electromagnetic coupling means for permitting the propagation therethrough of RF electromagnetic energy;

said second cavity having a second electromagnetic coupling means for permitting the propagation therethrough of said RF electromagnetic energy, the distance between said first gap and said second gap being sufficient to cause a phase shift in said modulated electron beam which is substantially equal to the phase shift occurring in said RF electromagnetic energy between said first gap and said second gap.

3. The apparatus according to claim 2 wherein said electromagnetic coupling means comprises an opening between said first cavity and said second cavity.

4. An extended interaction output circuit [EIOC] for interacting with a modulated electron beam and outputting RF electromagnetic energy, said EIOC comprising:

a first cavity;

a second cavity being coupled to said first cavity;

a third cavity being coupled to said second cavity;

said first, second and third cavities acting as an RF filter network having first and second RF filters having, respectively, first and second image impedances and a load impedance, said second image impedance being approximately one half the magnitude of said first image impedance, said load impedance being approximately one third the magnitude of said first image impedance.

5. The apparatus according to claim 4 wherein said first cavity has a first gap, said second cavity has a second gap and said third cavity has a third gap; and wherein said first and second cavities share a first electromagnetic coupling means for permitting the propagation therethrough of said RF energy, said second and said third cavities share a second electromagnetic coupling means while said third cavity shares an electromagnetic coupling means with the output of said EIOC;

said first and second gaps being spaced a first predetermined distance apart from one another, said distance being sufficient to cause a phase shift in said modulated electron beam which is substantially equal to the phase shift occurring in RF energy between said first and second gaps;

said second and third gaps being spaced a second predetermined distance apart from one another, said second distance being sufficient to cause a first phase shift in said modulated electron beam which is substantially equal to the phase shift occurring in said RF energy between said first and second gaps;

said second and third gaps being a second predetermined distance apart, said second distance being sufficient to cause a second phase shift in said modulated electron beam which is substantially equal to the phase shift occurring in said RF energy between said second and third gaps.

6. The apparatus according to claim 5 wherein said first and second electromagnetic coupling means comprise, respectively, first and second openings of predetermined dimensions.

7. An electromagnetic output circuit for outputting RF electromagnetic energy to a transmission means, said electromagnetic output circuit receiving a modulated electron beam and RF electromagnetic energy, said electromagnetic output circuit comprising:

a first cavity, said first cavity having a gap for permitting the traveling therethrough of said modulated electron beam and a first coupling means for permitting the traveling therethrough of said electromagnetic energy; and a second cavity, said second cavity being coupled to said first cavity and having a second gap for permitting the traveling therethrough of said modulated electron beam, said second cavity also having a second coupling means for permitting the traveling therethrough of said electromagnetic energy, the distance between said first gap and said second gap being sufficient to cause a phase shift in said modulated electron beam between said first and said second gaps which is substantially equal to the phase shift occurring in said electromagnetic wave between said first and said second gaps;

wherein the volume of said first and second cavities and the dimensions of said gaps and said first and second coupling means are proportioned such that the image impedance of said electromagnetic output circuit is approximately twice the magnitude of its output load resistance.

8. An electromagnetic output circuit for outputting RF electromagnetic energy to a transmission means, said electromagnetic output circuit receiving a modulated electron beam and RF electromagnetic energy, said electromagnetic output circuit comprising:

a first cavity, said first cavity having a gap for permitting the traveling therethrough of said modulated electron beam and a first coupling means for permitting the traveling therethrough of said electromagnetic energy; and a second cavity, said second cavity being coupled to said first cavity and having a second gap for permitting the traveling therethrough of said modulated electron beam, said second cavity also having a second coupling means for permitting the traveling therethrough of said electromagnetic energy, the distance between said first gap and said second gap being sufficient to cause a phase shift in said modulated electron beam between said first and said second gaps which is substantially equal to the phase shift occurring in said electromagnetic wave between said first and said second gaps;

a third cavity, said third cavity being coupled to said second cavity and having a third gap for permitting the traveling therethrough of said modulated electron beam, said third cavity also having a third coupling means for permitting the traveling therethrough of said electromagnetic energy, the distance between said second gap and said third gap being sufficient to cause a phase shift in said modulated electron beam between said second and said third gaps which is substantially equal to the phase shift occurring in said electromagnetic wave between said second and said third gaps;

said first, second and third cavities, said first, second and third gaps, and said first, second and third electromagnetic coupling means being accurately proportioned such that said electromagnetic output circuit acts as two RF electromagnetic filters having, respectively, first and second image impedances, wherein said second image impedance being approximately one half the magnitude of said first image impedance and wherein the load impedance of said first and second filters is approximately one third the magnitude of said first image impedance.

9. An electromagnetic output circuit for outputting RF electromagnetic energy to a transmission means, said electromagnetic output circuit receiving a modulated electron beam and RF electromagnetic energy, said electromagnetic output circuit comprising:

a first cavity having a first predetermined volume and defining a gap having a first predetermined distance;

a second cavity, said second cavity being coupled to said first cavity and having a second predetermined volume and defining a second gap having a second predetermined distance, said first cavity and said second cavity sharing a first aperture of a first predetermined area;

wherein said first and second predetermined volumes, said first and second predetermined distances and said first and second areas create an image impedance in said electromagnetic output circuit which is approximately twice the magnitude of its output load resistance.

10. An electromagnetic output circuit for outputting RF electromagnetic energy to a transmission means, said electromagnetic output circuit receiving a modulated electron beam and RF electromagnetic energy, said electromagnetic output circuit comprising:

a first cavity having a first predetermined volume and defining a first gap having a first predetermined distance;

a second cavity, said second cavity being coupled to said first cavity and having a second predetermined volume and a second gap having a second predetermined distance, said first and said second cavities sharing a first aperture defining a first area;

a third cavity, said third cavity being coupled to said second cavity and having a third gap for permitting the traveling therethrough of said modulated electron beam, said third cavity also having a third coupling means for permitting the traveling therethrough of said electromagnetic energy, the distance between said second gap and said third gap being sufficient to cause a phase shift in said modulated electron beam between said second and said third gaps which is substantially equal to the phase shift occurring in said electromagnetic wave between said second and said third gaps;

said first, second and third cavities, said first, second and third gaps, and said first, second and third electromagnetic coupling means being accurately proportioned such that said electromagnetic output circuit acts as two RF electromagnetic filters having, respectively, first and second image impedances and a load impedance, said second image impedance being approximately one half the magnitude of said first image impedance while said load impedance is approximately one third the magnitude of said first image impedance.

* * * * *